(12) United States Patent
Losee et al.

(10) Patent No.: US 9,735,237 B2
(45) Date of Patent: Aug. 15, 2017

(54) ACTIVE AREA DESIGNS FOR SILICON CARBIDE SUPER-JUNCTION POWER DEVICES

(71) Applicant: GENERAL ELECTRIC COMPANY, Schenectady, NY (US)

(72) Inventors: Peter Almern Losee, Clifton Park, NY (US); Alexander Viktorovich Bolotnikov, Niskayuna, NY (US); Reza Ghandi, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 14/752,446

(22) Filed: Jun. 26, 2015

(65) Prior Publication Data

US 2016/0380059 A1   Dec. 29, 2016

(51) Int. Cl.
| | |
|---|---|
| H01L 29/15 | (2006.01) |
| H01L 29/16 | (2006.01) |
| H01L 29/06 | (2006.01) |
| H01L 29/66 | (2006.01) |
| H01L 29/872 | (2006.01) |
| H01L 29/808 | (2006.01) |

(52) U.S. Cl.
CPC ...... *H01L 29/1608* (2013.01); *H01L 29/0634* (2013.01); *H01L 29/6606* (2013.01); *H01L 29/872* (2013.01); *H01L 29/8083* (2013.01)

(58) Field of Classification Search
CPC ............ H01L 29/1608; H01L 29/0634; H01L 21/046
See application file for complete search history.

(56) References Cited

U.S. PATENT DOCUMENTS

| | | |
|---|---|---|
| 6,037,632 A | 3/2000 | Omura et al. |
| 7,595,241 B2 | 9/2009 | Matocha et al. |
| 8,476,698 B2 | 7/2013 | Guan et al. |

(Continued)

FOREIGN PATENT DOCUMENTS

| | | |
|---|---|---|
| CN | 103413823 A | 11/2013 |
| JP | 2001144292 A | 5/2001 |
| JP | 2003069040 A | 3/2003 |

OTHER PUBLICATIONS

Ryoji Kosugi et al.,"Development of SiC Super-Junction (SJ) Device by Deep Trench-Filling Epitaxial Growth", Silicon Carbide and Related Materials 2012, Materials Science Forum, Jan. 2013, pp. 785-788, vols. 740-742.

(Continued)

*Primary Examiner* — Shaun Campbell
(74) *Attorney, Agent, or Firm* — John P. Darling

(57) ABSTRACT

The subject matter disclosed herein relates to silicon carbide (SiC) power devices and, more specifically, to active area designs for SiC super-junction (SJ) power devices. A SiC-SJ device includes an active area having one or more charge balance (CB) layers. Each CB layer includes a semiconductor layer having a first conductivity-type and a plurality of floating regions having a second conductivity-type disposed in a surface of the semiconductor layer. The plurality of floating regions and the semiconductor layer are both configured to substantially deplete to provide substantially equal amounts of charge from ionized dopants when a reverse bias is applied to the SiC-SJ device.

18 Claims, 9 Drawing Sheets

(56) References Cited

U.S. PATENT DOCUMENTS

| | | |
|---|---|---|
| 8,604,541 B2 | 12/2013 | Huang et al. |
| 8,610,210 B2 | 12/2013 | Ohta et al. |
| 8,642,427 B1 | 2/2014 | Sihombing et al. |
| 8,673,700 B2 | 3/2014 | Yedinak et al. |
| 2006/0214221 A1* | 9/2006 | Challa ............... H01L 21/3065 257/328 |
| 2010/0025760 A1* | 2/2010 | Kawashima ........ H01L 29/0634 257/334 |
| 2013/0264582 A1 | 10/2013 | Hayashi |

OTHER PUBLICATIONS

Ming Qiao, "High voltage SOI VLD PMOS with charge-balanced surface super junction layer", Communications, Circuits and Systems (ICCCAS), 2013 International Conference on, IEEE, Nov. 15-17, 2013, pp. 366-369, vol. 2, Conference Location: Chengdu.

Ryoji Kosugi et al., "Development of SiC Super-Junction (SJ) Devices by Multi-Epitaxial Growth", Silicon Carbide and Related Materials 2013, Materials Science Forum, Feb. 2014, pp. 845-850, vols. 778-780.

Hao Yuan et al., "The Fabrication of 4H—SiC Floating Junction SBDs (FJ_SBDs)", Silicon Carbide and Related Materials 2013, Materials Science Forum, Feb. 2014, pp. 812-815, vols. 778-780.

K. Kojima et al., "Filling of Deep Trench by Epitaxial SiC Growth", Silicon Carbide and Related Materials 2012, Materials Science Forum, Jan. 2013, pp. 793-796, vols. 740-742.

Shinichiro Miyahara et al., "Effect of Damage Removal Treatment after Trench Etching on the Reliability of Trench MOSFET", Silicon Carbide and Related Materials 2012, Materials Science Forum, pp. 789-792, vols. 740-742.

Bin et al., "Modeling of 4H—SiC Multi-Floating-Junction Schottky Barrier Diode", Chinese Physics B, vol. 19, Issue No. 10, pp. 107101-1-107101-6, 2010.

PCT Search Report and Written Opinion issued in connection with corresponding PCT Application No. PCT/US2016/039242 on Sep. 29, 2016.

* cited by examiner

ACTIVE AREA DESIGNS FOR SILICON CARBIDE SUPER-JUNCTION POWER DEVICES

BACKGROUND

The subject matter disclosed herein relates to silicon carbide (SiC) power devices and, more specifically, to active area designs for SiC super-junction power devices.

For semiconductor power devices, super-junction (also referred to as charge balance) designs offer several advantages. For example, super-junction devices demonstrate reduced resistance and reduced conduction losses per unit area relative to traditional unipolar device designs. In silicon (Si) super-junction devices, an active area may be formed by implanting or diffusing a number of vertical pillars of a first dopant type (e.g., p-type) into a Si device layer of a second dopant type (e.g., n-type). The vertical pillars of these Si super-junction devices extend through the thickness (e.g., tens of micrometers) of the Si epitaxial device layer, which can be achieved using existing Si epitaxy, implantation and/or diffusion methods.

However, in silicon carbide (SiC), dopants have significantly lower diffusion coefficient/implantation range than in Si. As a result, when a feature (e.g., a vertical charge-balance region) is formed into a SiC epitaxial layer using an implantation energy that is typical of Si processing, the dopants are unable to penetrate into the SiC layer as deep as they would into the Si layer. For example, typical commercial ion implantation systems for Si device fabrication enable dopant implantation energies up to about 380 keV. Such implantation energies only enable dopant implantation to a maximum depth between approximately 0.5 μm and approximately 1 μm into the surface of a SiC epitaxial layer.

BRIEF DESCRIPTION

In an embodiment, a SiC-SJ device includes an active area having one or more charge balance (CB) layers. Each CB layer includes a semiconductor layer having a first conductivity-type and a plurality of floating regions having a second conductivity-type disposed in a surface of the semiconductor layer. The plurality of floating regions and the semiconductor layer are both configured to substantially deplete to provide substantially equal amounts of charge from ionized dopants when a reverse bias is applied to the SiC-SJ device.

In an embodiment, a method of manufacturing a silicon carbide (SiC) super-junction (SJ) device includes fabricating a first charge balance (CB) layer by forming a first semiconductor layer having a first conductivity-type on top of a SiC substrate layer and implanting a first plurality of floating regions having a second conductivity-type into the first semiconductor layer. The doping concentration of the first plurality of floating regions is between approximately $2 \times 10^{16}$ cm$^{-3}$ and approximately $1 \times 10^{18}$ cm$^{-3}$. Additionally, a spacing between the first plurality of floating regions is greater than or equal to 10% of a thickness of the first semiconductor layer and less than or equal to the thickness of the first semiconductor layer.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
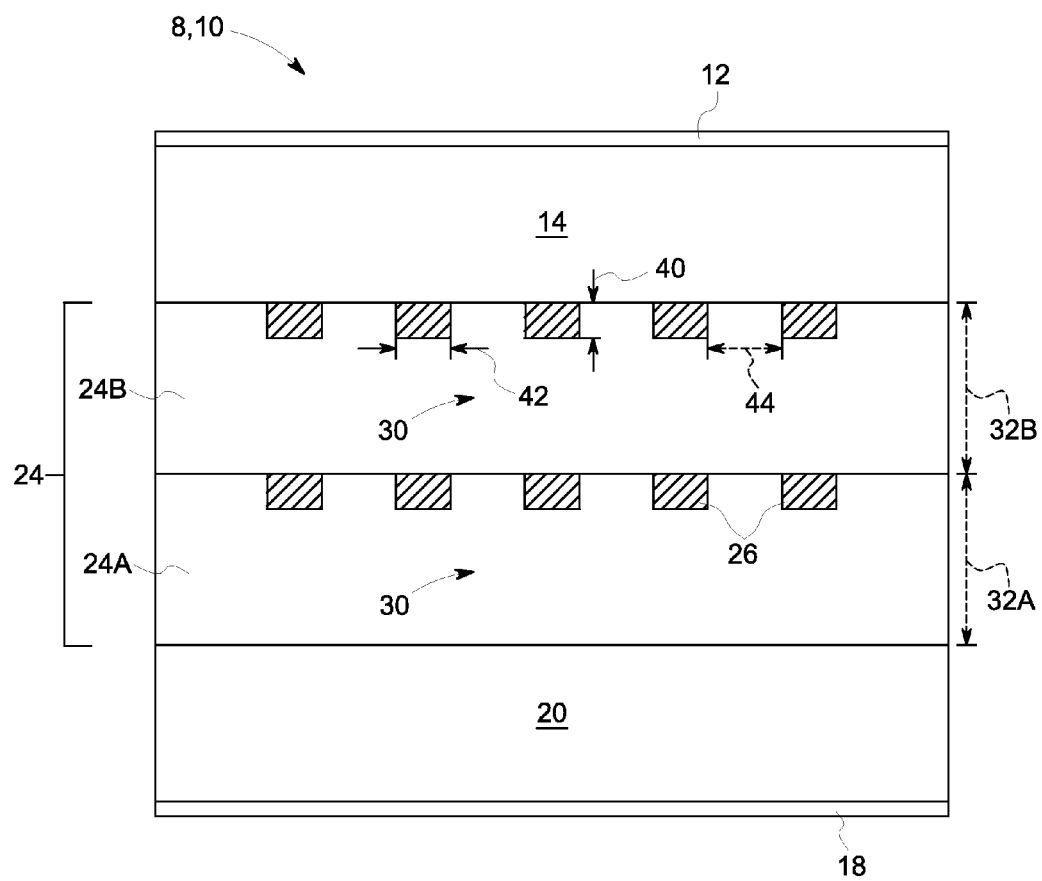
FIG. 1 is a schematic illustrating a cross-sectional view of the active area of a multi-layer silicon carbide super-junction (SiC-SJ) Schottky diode having drift layers that include floating regions, in accordance with the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. As used herein, the term "room temperature" refers to the temperature range between approximately 20° C. and approximately 27° C.

Present embodiments are directed toward designs and methods for manufacturing SiC vertical charge-balance devices, also referred to as SiC super-junction (SiC-SJ) devices. The disclosed designs and methods are useful in the manufacture of SiC-SJ devices, such as metal-oxide-semiconductor field-effect transistors (MOSFETs), junction field effect transistors (JFETs), bipolar junction transistors (BJTs), diodes, as well as other SiC-SJ devices that may be useful for medium-voltage (e.g., 2 kV-10 kV) and high-voltage (e.g., greater than 10 kV) power conversion related applications. As discussed below, the disclosed SiC-SJ device designs include multi-layered active cell structures implemented using repeated epitaxial growth and dopant implantation steps. As used herein, the term "multi-layered," as well as references to a particular number of layers (e.g., "two-layered," "three-layered," "four-layered,"), refers to the number of epitaxial layers of the SiC super-junction device.

The disclosed multi-layered SiC-SJ designs and manufacturing techniques enable the production of SiC-SJ devices, despite the aforementioned low diffusion coefficients of dopants in SiC compared to Si. The disclosed multi-layered SiC-SJ designs offer reduced conduction losses and switching losses compared to existing SiC or Si power devices having the same current/voltage rating. Further, the disclosed multi-layered SiC-SJ designs enable operation at significantly higher current densities than conventional SiC high-voltage unipolar devices, and higher switching frequencies than conventional SiC high-voltage bipolar devices. The disclosed SiC-SJ device designs are also generally robust to both n-type and p-type doping variability, which improves device yield and performance. Further, having drift layers doped higher than allowed by the one-dimensional (1-D) limit of conventional designs, the disclosed SiC-SJ devices enable lower conduction losses for a given blocking voltage rating compared to conventional 1-D designs. Additionally, certain disclosed SiC-SJ device embodiments may be manufactured using common semiconductor fabrication equipment, such as ion implantation systems used by existing Si/SiC device manufacturing, to provide additional cost benefits.

As discussed in detail below, the disclosed SiC-SJ active cell designs include floating regions of n-type or p-type doping (e.g., floating charge-balance blocks) that reshape the electric field in the active area of a SiC-SJ power device. These regions are referred to herein as "floating" in that are disposed within the drift layers of the SiC-SJ device and are not in contact with a device terminal. For the disclosed SiC-SJ device embodiments, as discussed below, these designs utilizing discrete floating regions enable low conduction losses and high blocking voltages while still maintaining a relatively simple fabrication process.

As set forth above, the presently disclosed SiC-SJ device embodiments' fabrication steps generally include repeated cycles of epitaxial overgrowth and ion implantation to form a multi-layered device structure. FIG. 1 is a schematic illustrating a cross-sectional view of the active area 8 of an embodiment of a SiC-SJ device 10 (i.e., a Schottky diode), in accordance with embodiments of the present approach. The illustrated SiC-SJ device 10 includes a top contact 12 disposed on an upper SiC epitaxial layer 14. While the upper SiC epitaxial layer 14 is doped during epitaxial growth, the layer 14 of the illustrated SiC-SJ device 10 does not include implanted doped regions. It may be noted that, for other types of SiC-SJ devices (e.g., MOSFETs, JBS, MPS, UMOSFETs, JFETs), the upper SiC epitaxial layer 14 may include doped regions or other suitable features, in accordance with the present disclosure. The illustrated SiC-SJ device 10 also includes a bottom contact 18 disposed below a SiC substrate layer 20 of the device 10.

In addition to epitaxial layer 14, the active area 8 of the SiC-SJ device 10 illustrated in FIG. 1 includes two epitaxial layers or "charge balance" (CB) layers 24A and 24B, each having floating regions 26. However, in certain embodiments, the SiC-SJ device 10 may include any suitable number of CB layers (e.g., 2, 3, 4, 5, 6, or more), yielding a multi-layered active cell structure 8. As discussed below, certain embodiments of the SiC-SJ device 10 may include a certain number of CB layers to provide desirable blocking capability (e.g., from approximately 2 kV to approximately 10 kV). The CB layers 24A and 24B each have a dopant concentration, which may be the same or different, in certain embodiments. Similarly, the dopant concentration in the floating regions 26 of the drift layer 24A and in the floating regions 26 of the drift layer 24B may be the same or different, in certain embodiments.

In terms of dimensions, the CB layers 24A and 24B have thicknesses 32A and 32B, respectively, that may be the same or different, in certain embodiments. In terms of dimensions, the floating regions 26 in the drift layers 24A and 24B of the illustrated SiC-SJ device 10 have a particular thickness 40, a particular width 42, and a particular spacing 44. In other embodiments, the dimensions (e.g., thickness 40, width 42, and/or spacing 44) of the floating regions 26 may be different in different CB layers.

For the illustrated SiC-SJ device 10 of FIG. 1, the floating regions 26 are oppositely doped relative to the remainder 30 of the SiC CB layers 24A and 24B. In other words, for SiC-SJ devices 10 having n-type SiC CB layers 24A and 24B, the floating regions 26 are p-type, and for SiC-SJ devices 10 having p-type CB layers 24A and 24B, the floating regions 26 are n-type. In different embodiments, these floating regions 26 may have different cross-sectional shapes (e.g., round, rectangular, triangular, or irregular shapes). For present embodiments, the shape of the floating regions may not substantially vary along the Z-axis.

As mentioned, the remainder 30 of CB layers 24 (i.e., the portion of the CB layers 24A and 24B that are not part of the floating regions 26) has the opposite conductivity-type relative to the floating regions 26. The floating regions 26 and the remainder 30 of the CB layers 24 each generally provide similar amounts of effective charge (e.g., per $cm^2$, normalized to device active area) from ionized dopants under reverse bias. As such, the illustrated charge balance structure allows the SiC-SJ device 10 to achieve high breakdown voltage and low on-state resistance, since the p-type semiconductor and the n-type semiconductor portions are both completely depleted under nominal blocking conditions.

It should be noted that the floating regions 26 in the active area 8 of the SiC-SJ device 10 are not vertically connected through (i.e., do not extend through the entire thicknesses 32A and 32B) of the CB layers 24. As such, the SiC-SJ device 10 may be described, more specifically, as being a partial super-junction device 10. It may be appreciated that this feature is in contrast to other SJ device designs in which the charge-balance regions are continuous (e.g., continuous vertical pillars that extend through the entire thicknesses 32A and 32B of the layers 24A and 24B) and are vertically connected to provide what may be described, more specifically, as a full charge-balance or full super-junction device. Full charge-balance devices are capable of providing low conduction losses and high blocking voltage. However, fabricating charge-balance regions that extend through the thicknesses 32A and 32B of layers 24A and 24B is challenging due to the aforementioned difficulty when doping SiC.

For example, in order to form charge balance regions that extend through the entire thickness of the drift region, as present in a full charge-balance device, numerous (e.g., 10+) thin epitaxial growth/shallow ion implantation steps may be performed. Alternatively, high energy implantation may be used along with high stopping power masking (e.g., silicon on insulator (SOI), polysilicon, thick silicon oxide, high-Z metals such as platinum, molybdenum, gold), which are not common for current high-volume Si/SiC manufacturing processes. In contrast, the floating regions 26 of the SiC-SJ device 10 are amenable to existing and maturing Si/SiC fabrication techniques and infrastructure. For example, as mentioned above, present (high volume) ion implantation tooling limits implant acceleration energies to much less than 1 MeV (e.g., approximately 380 keV). At these energies, the projected range (e.g., the penetration depth) of most commonly used SiC dopants (e.g., nitrogen, phosphorus, aluminum) is approximately 1 μm or less, which is suitable for implantation of the floating regions 26, as discussed below.

Figure 2A:
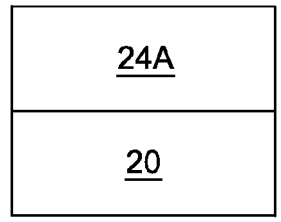
FIGS. 2A-E are schematics illustrating an embodiment of the SiC-SJ device of FIG. 1 across several steps of fabrication.
Figure 2B:
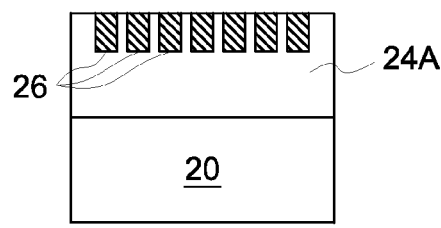

FIGS. 2A-E illustrate cross-sectional views of the SiC-SJ device 10 of FIG. 1 at various stages during an example method of fabrication. The example method begins with a first epitaxial layer 24A being formed on top of the SiC substrate layer 20 using epitaxial SiC growth techniques to yield the structure illustrated in FIG. 2A. Subsequently, as illustrated in FIG. 2B, the floating regions 26 may be formed in the epitaxial layer 24A using ion implantation to yield the CB layer 24A. The dimensions and positions of the floating regions 26 for various embodiments are discussed in greater detail below.

Figure 2C:
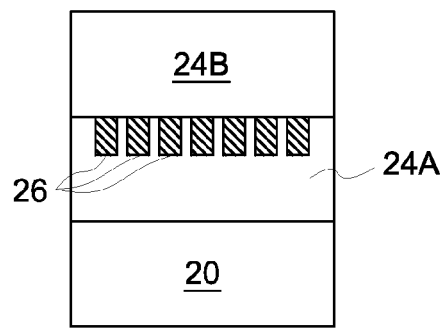
Figure 2D:
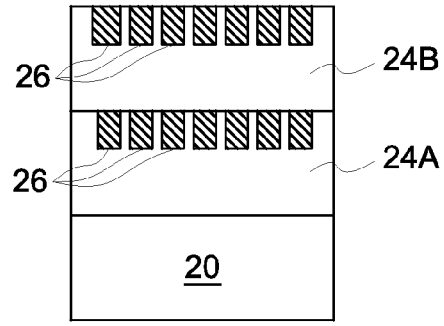
Figure 2E:
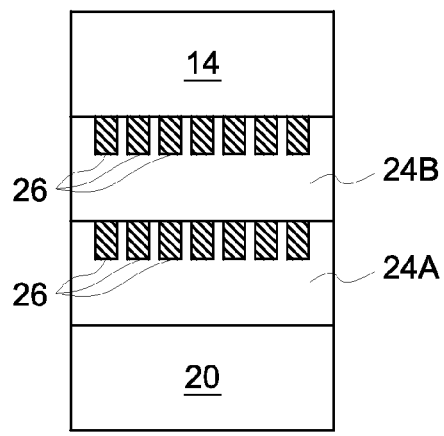

Next, as illustrated in FIG. 2C, a second epitaxial layer 24B (i.e., another epitaxial SiC layer) may be formed on top of the first drift layer 24B. Subsequently, as illustrated in FIG. 2D, ion implantation may be used to form the floating regions 26 in the epitaxial layer 24B to yield the CB layer 24B. Then, as illustrated in FIG. 2E, the upper SiC epitaxial layer 14 may be formed on top of the uppermost SiC layer 24B. It should be understood that the steps illustrated in FIGS. 2C and 2D may be repeated multiple (e.g., 2, 3, 4, 5, or more) times to yield multi-layered (e.g., three-layered, four-layered, five-layered, or more) SiC-SJ device embodiments, in accordance with the present disclosure. After the upper SiC epitaxial layer 14 is completed, then standard device processing steps may be performed (e.g., including forming the top contact 12 and bottom contact 18 illustrated in FIG. 1), to yield the SiC-SJ device 10.

The performance benefits of the presently disclosed SiC-SJ device 10 were demonstrated through computational simulations and confirmed through fabrication and testing of various embodiments of the SiC-SJ device 10 illustrated in FIG. 1, as presented in the electrical data below with respect to FIGS. 3-7. In particular, the device characteristics presented in FIGS. 3-7 are representative of embodiments of an example 3 kV SiC-SJ device 10 having p-type floating regions 26 disposed within two n-type CB layers 24A and 24B, as illustrated in FIG. 1. It is presently recognized, based on the data below, that particular parameters of the SiC-SJ device 10 enable desirable electrical performance for the SiC-SJ 10, including the doping of the layers 24, the doping of the floating regions 26, the thicknesses of the layers 24, the thickness 40 of the floating regions 26, the width 42 of the floating regions 26, and the spacing 44 between the floating regions 26, the doping of the floating regions 26. Ranges for these parameters are discussed below for various embodiments.

For the embodiments of the SiC-SJ device 10 of FIG. 1, the doping concentration of the floating regions 26 divided by the thickness 40 is greater than or equal to approximately $5 \times 10^{12}$ cm$^{-3}$ and less than or equal to approximately $5 \times 10^{18}$ cm$^{-3}$. In certain embodiments, the doping concentration of the floating regions 26 may be greater than or equal to $2 \times 10^{16}$ cm$^{-3}$ and less than or equal to $1 \times 10^{18}$ cm$^{-3}$. In certain embodiments, the doping concentration of the floating regions 26 may be greater than or equal to $5 \times 10^{16}$ cm$^{-3}$ and less than or equal to $5 \times 10^{17}$ cm$^{-3}$. Additionally, in certain embodiments, the effective sheet doping concentration of the floating regions 26 is less than or equal to $1.1 \times 10^{13}$ cm$^{-2}$. It may be appreciated that the effective sheet doping of the floating regions 26 may be calculated by normalizing the doping concentration of these floating regions 26 to the unit cell area of the SiC-SJ device. The motivation behind the upper and lower bounds of these ranges is discussed in detail below.

Figure 3:
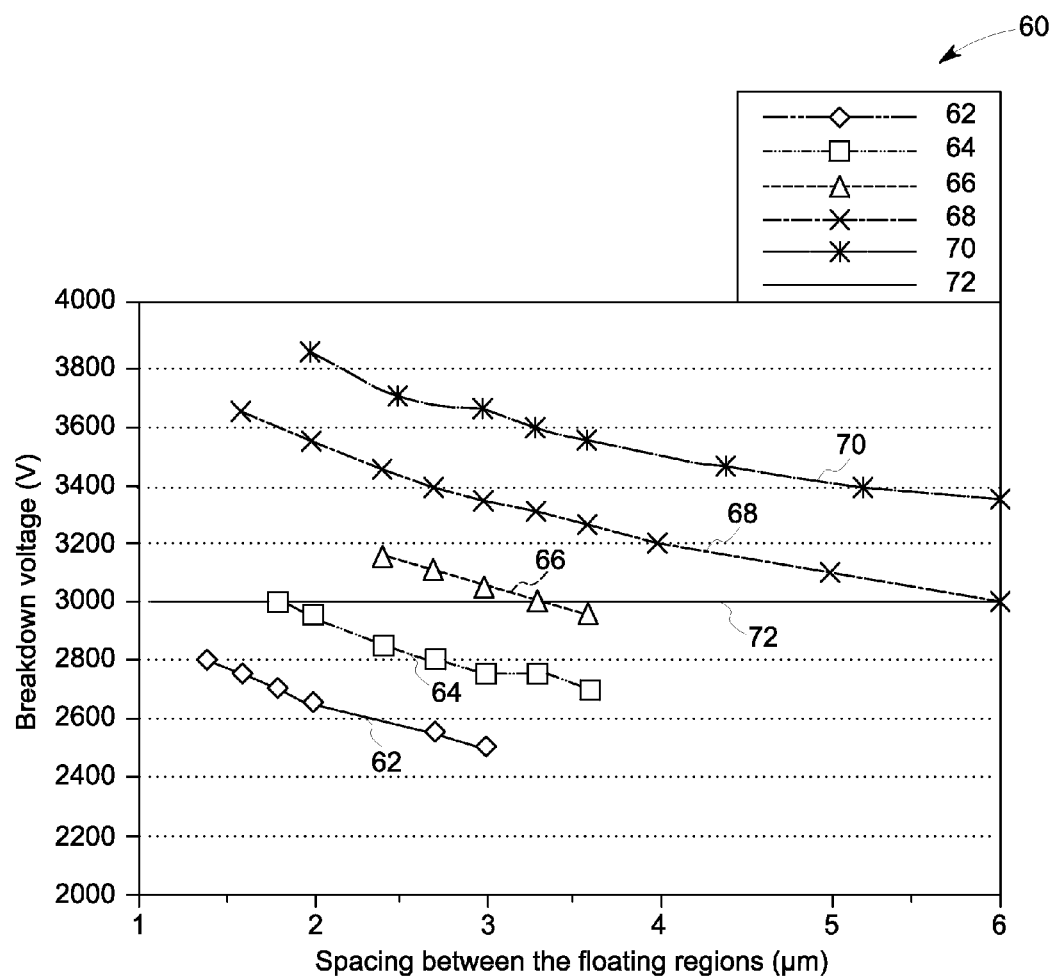
FIG. 3 is a graph illustrating an example of breakdown voltage versus spacing between the floating regions for embodiments the SiC-SJ device of FIG. 1 having different SiC epitaxial layer dopant concentrations.

For the embodiments of the SiC-SJ device 10 of FIG. 1, if the doping concentration of the p-type floating regions 26 is low (e.g., less than approximately $2 \times 10^{16}$ cm$^{-3}$), then the doping concentration of the n-type layers 24A and 24B would be commensurately low in order to provide a charge balanced SiC-SJ device 10. FIG. 3 is a graph 60 illustrating breakdown voltage versus the spacing 44 between the floating regions 26 for embodiments the SiC-SJ device 10. In particular, FIG. 3 illustrates the breakdown voltage for five different embodiments of the SiC-SJ device 10, each having a different dopant concentration for their respective n-type SiC epitaxial layers 24A and 24B (i.e., curve 62 representing a dopant concentration of $6.5 \times 10^{15}$ cm$^{-3}$; curve 64 representing a dopant concentration of $6 \times 10^{15}$ cm$^{-3}$; curve 66 representing a dopant concentration of $5.5 \times 10^{15}$ cm$^{-3}$; curve 68 representing a dopant concentration of $5 \times 10^{15}$ cm$^{-3}$; and curve 70 representing a dopant concentration of $4.5 \times 10^{15}$ cm$^{-3}$), with different spacing 56 between the floating regions 26 (i.e., ranging from 1 μm to 6 μm). Further, for the embodiments of the SiC-SJ device 10 represented in FIG. 3, the dopant concentration of the floating regions 26 is $3 \times 10^{16}$ cm$^{-3}$, the thicknesses 32A and 32B of the n-type drift layers are 10 μm, the width 42 of the floating regions 26 is 2 μm, and the thickness 40 of the floating regions 26 is 1 μm.

Figure 4:
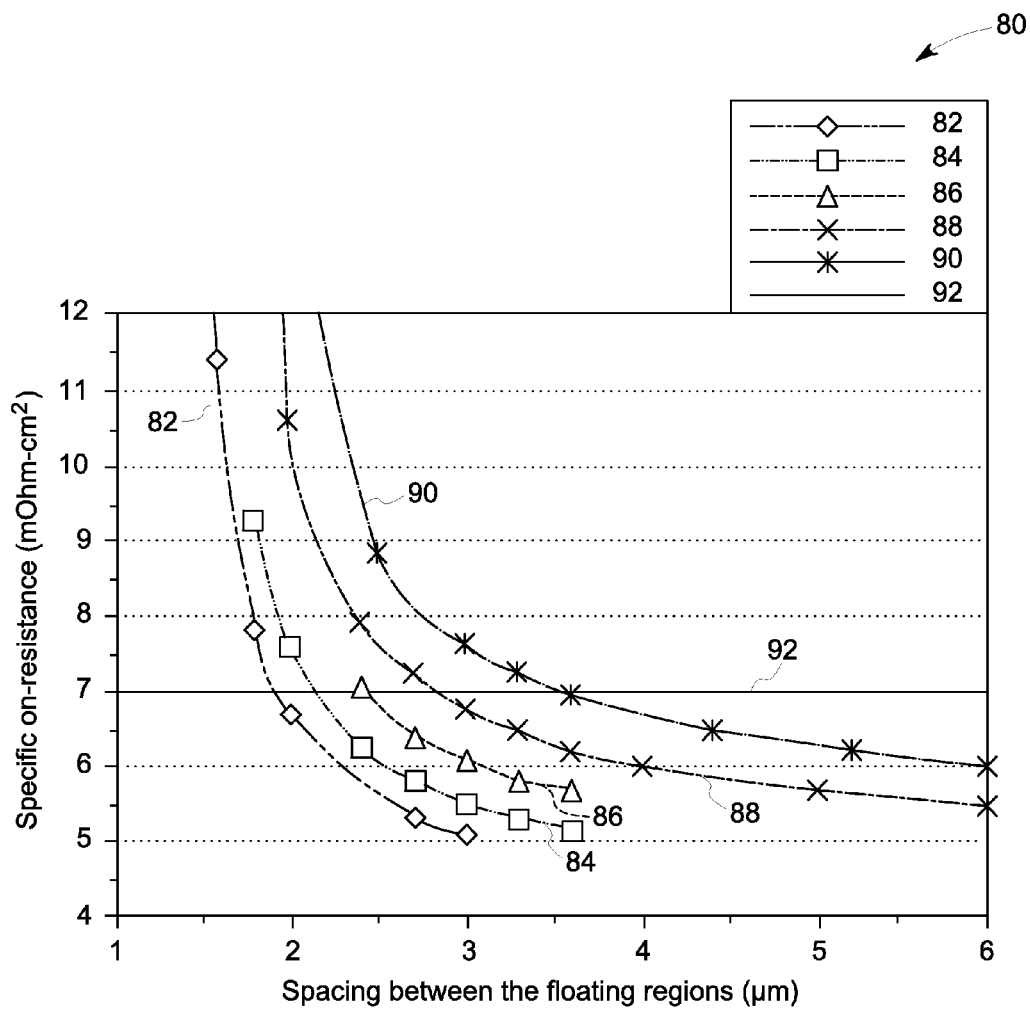
FIG. 4 is a graph illustrating an example of SiC SJ drift layer specific on-resistance versus spacing between the floating regions for various embodiments of the SiC-SJ device of FIG. 1 having different SiC epitaxial layer dopant concentrations.

FIG. 4 is a graph 80 illustrating room temperature specific on-resistance of a drift layer (at current density equal to 100 A/cm$^2$) versus the spacing 44 between the floating regions 26 for the various SiC-SJ device embodiments represented in FIG. 3. In particular, five curves are illustrated in the graph 80 of FIG. 4, each representing a different doping concentrations of the n-type epi layers 24A and 24B (i.e., curve 82 representing a dopant concentration of $6.5 \times 10^{15}$ cm$^{-3}$; curve 84 representing a dopant concentration of $6 \times 10^{15}$ cm$^{-3}$; curve 86 representing a dopant concentration of $5.5 \times 10^{15}$ cm$^{-3}$; curve 88 representing a dopant concentration of $5 \times 10^{15}$ cm$^{-3}$; and curve 90 representing a dopant concentration of $4.5 \times 10^{15}$ cm$^3$). As may be seen in FIG. 4, using the dopant concentration discussed above (i.e., $5.5 \times 10^{15}$ cm$^{-3}$) in the layers 24, the resulting specific drift on-resistance of the SiC-SJ device embodiments range from approximately 5.5 mOhm-cm$^2$ to greater than 7 mOhm-cm$^2$, when the spacing 44 between the floating regions 26 ranges between 2.5 um and 4 um. As shown in FIGS. 3 and 4, the disclosed SiC-SJ device designs enables blocking voltages greater than or equal to 3 kV and specific on-resistance of drift region less than 7 mOhm-cm², which represent performance improvements over conventional unipolar devices.

Figure 5:
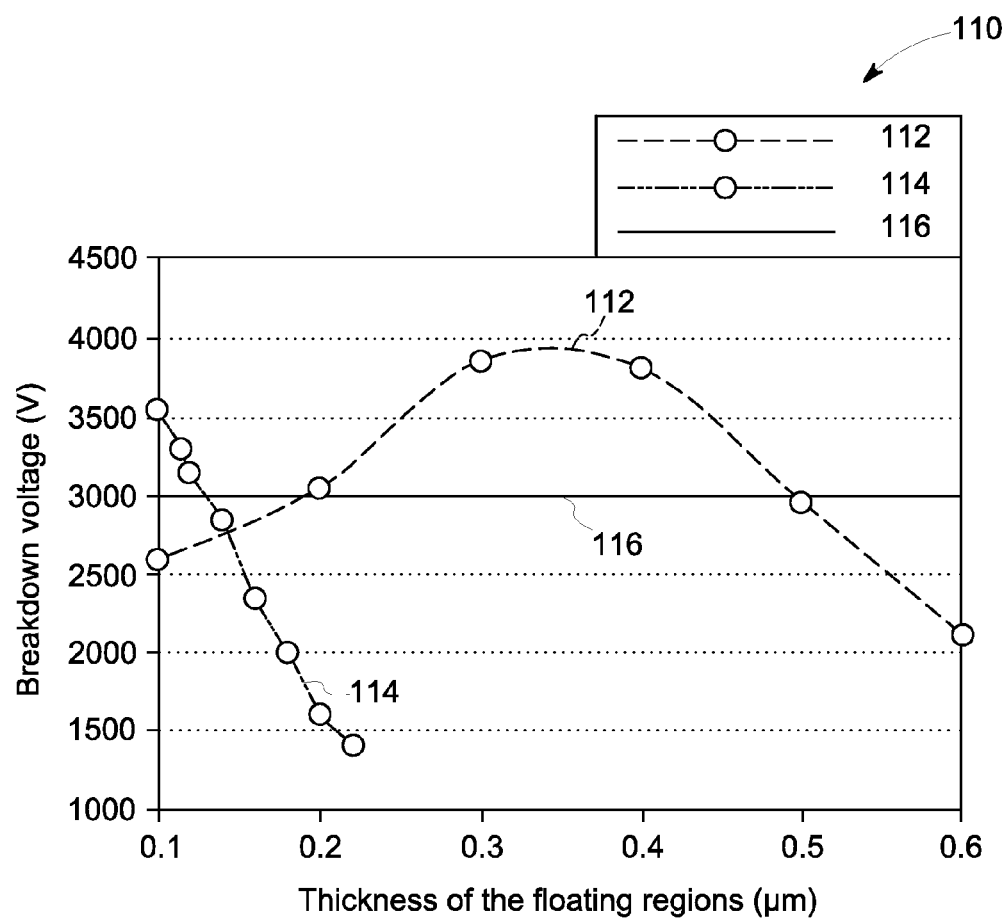
FIG. 5 is a graph illustrating an example of breakdown voltage versus junction depth of the floating regions for two embodiments of the SiC-SJ device of FIG. 1 having different floating region dopant concentrations.
Figure 6:
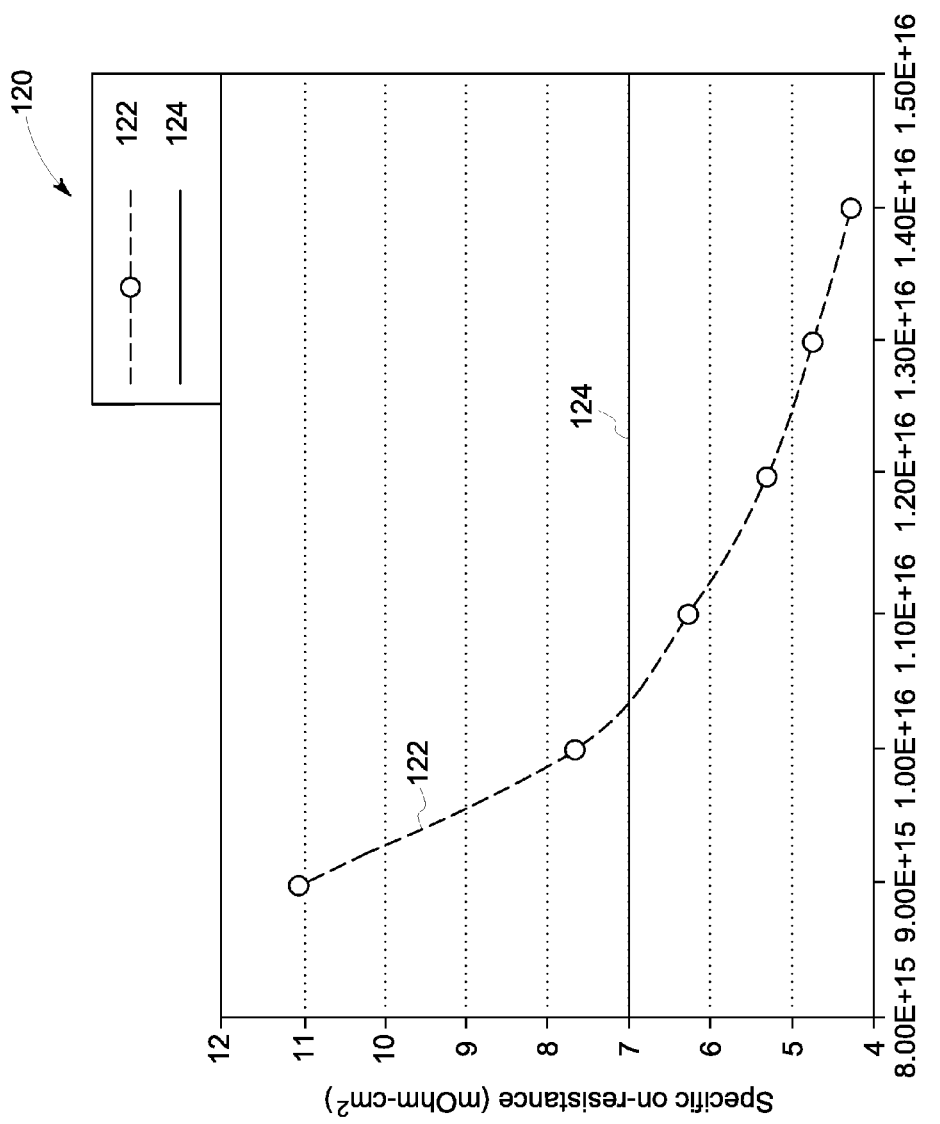
FIG. 6 is a graph illustrating specific on-resistance versus dopant concentration of the drift layer for an embodiment of the SiC-SJ device of FIG. 1 having a spacing of 2 μm between the floating regions.

For the embodiments of the SiC-SJ device 10 of FIG. 1, if the doping concentration of the floating regions 26 is too high (e.g., greater than approximately $5 \times 10^{18}$ cm$^{-3}$), then the feature sizes that would provide the best performance are difficult fabricate using existing SiC fabrication processes. FIG. 5 is a graph 110 illustrating breakdown voltage versus thickness 40 of the floating regions 26 for two different embodiments of the SiC-SJ device 10 having different doping concentrations in the floating regions 26 (i.e., curve 112 representing a doping concentration of $5 \times 10^{17}$ cm$^{-3}$; and curve 114 representing a doping concentration of $1 \times 10^{18}$ cm$^{-3}$). For the embodiments of the SiC-SJ device 10 represented in FIG. 5, the spacing 44 between the floating regions 26 is 1 µm, the thicknesses 32A and 32B of each of the drift layers is 10 µm, and the width 42 of the floating regions 26 is 0.6 µm. To increase block doping concentration above $5 \times 10^{18}$ cm$^{-3}$ (e.g., $1 \times 10^{19}$ cm$^{-3}$) the thickness 44 of the floating regions 26 would become less than 1 um, which is impractical for implant and epitaxial overgrowth processes.

For the embodiments of the SiC-SJ device 10 of FIG. 1, to achieve a blocking voltage of 3 kV (as illustrated by horizontal line 116 in FIG. 5), the thickness 40 of the floating regions 26 should be less than approximately 0.2 µm and the width 42 of the floating regions 26 should be less than 1 µm. Accordingly, using more moderate doping in the floating regions 26 enables good performance using feature sizes that are manageable using existing semiconductor fabrication processes. It may also be appreciated that fabricating floating regions 26 having very small thickness 40 and/or very narrow widths 42 may be difficult with the multiple epitaxial SiC regrowth steps, in which in-situ etching prior to growth is typically used and may consume a portion of the implanted floating regions 26. Additionally, autodoping, outdiffusion, lateral straggle, and/or finite diffusion of implanted dopants may occur during the multiple exposures to the high temperature (e.g., greater than approximately 1650° C.) epitaxial SiC growth steps, which may also present problems when using exceedingly small lateral features.

As discussed in greater detail below, the spacing 44 between the floating regions 26 for embodiments of the SiC-SJ device 10 of FIG. 1 may be greater than or equal to 10% of the thickness of the CB layer (e.g., 10% of the thickness 32A of layer 24A), and the spacing 44 may be less than or equal to the thickness of the CB layer thickness (e.g., the thickness 32A of the layer 24A). In certain embodiments, the spacing 44 between the floating regions 26 may be greater than or equal to 1 µm and less than or equal to approximately 6 µm. The motivation behind the upper and lower bounds of these ranges is discussed in detail below.

For the embodiments of the SiC-SJ device 10 of FIG. 1, when the spacing 44 between the floating regions 26 is small, the SiC-SJ device 10 may become increasingly sensitive to process variations (e.g., lateral diffusion, variations in pattern feature size, as illustrated in FIG. 4.), and variations in doping concentration throughout the drift layers 24A and 24B. As illustrated by the curve 122 of FIG. 6, in order to maintain low drift layer specific on-resistance with narrow spacing 44 between the floating regions 26 of charge, the n-type doping concentration of the CB layers 24A and 24B should be relatively high (e.g., greater than or equal to $1 \times 10^{16}$ cm$^{-3}$). However, in order to maximize the blocking voltage for the embodiment of the SiC-SJ device 10, the doping concentration should be such that the integrated doping of the epitaxial layer of a CB layer (e.g., CB layer 24A or 24B) is below a particular value. For example, in certain embodiments of the SiC-SJ device 10, the product of the thickness 32A and the uniform n-type dopant concentration of the epi layer 24A may be less than approximately $1.1 \times 10^{13}$ cm$^{-2}$ in order to provide efficient charge balance. Moving toward the lower manufacturable limit for minimum spacing 44 between the floating regions 26 (e.g., approximately 1 µm for processes involving multiple SiC epitaxial regrowth steps), drift layer specific on-resistance is minimized at a n-type dopant concentration in the drift layers 24A and 24B of approximately $2 \times 10^{16}$ cm$^{-3}$.

With the foregoing in mind, in certain embodiments, the thicknesses 32A and 32B of each of the drift layers 24A and 24B may be between approximately 5 µm to approximately 20 µm (e.g., between approximately 5 µm to approximately 6 µm) in order to provide the desired charge balance. As such, certain embodiments the SiC-SJ device 10 may involve up to four epitaxial growth/ion implantation steps to provide a 3 kV blocking voltage with doping concentrations in the drift layers 24A and 24B of $2 \times 10^{16}$ cm$^{-3}$. Since additional SiC epitaxial growth/implantation cycles increase cost, complexity, and potentially lowers the yield for embodiments of the SiC-SJ device 10, the spacing 44 between the floating regions 26 may be greater than approximately 1 µm, as set forth above, in certain embodiments, to reduce the number of epitaxial growth steps and enable charge balance device performance benefits. Additionally, the spacing 44 between the floating regions 26 may also be maintained below a maximum value to enable practical implementation and fabrication of the SiC-SJ device structure. For example, if the spacing 44 between the floating regions 26 is exceedingly large (e.g., if the spacing 44 is greater than the thickness 32A or 32B of the drift layers 24A or 24B), then the n-type doping concentration in the SiC epitaxial layers 24A and 24B may be lower to maintain BV, which may undesirably increase the specific on-resistance of the device.

Figure 7:
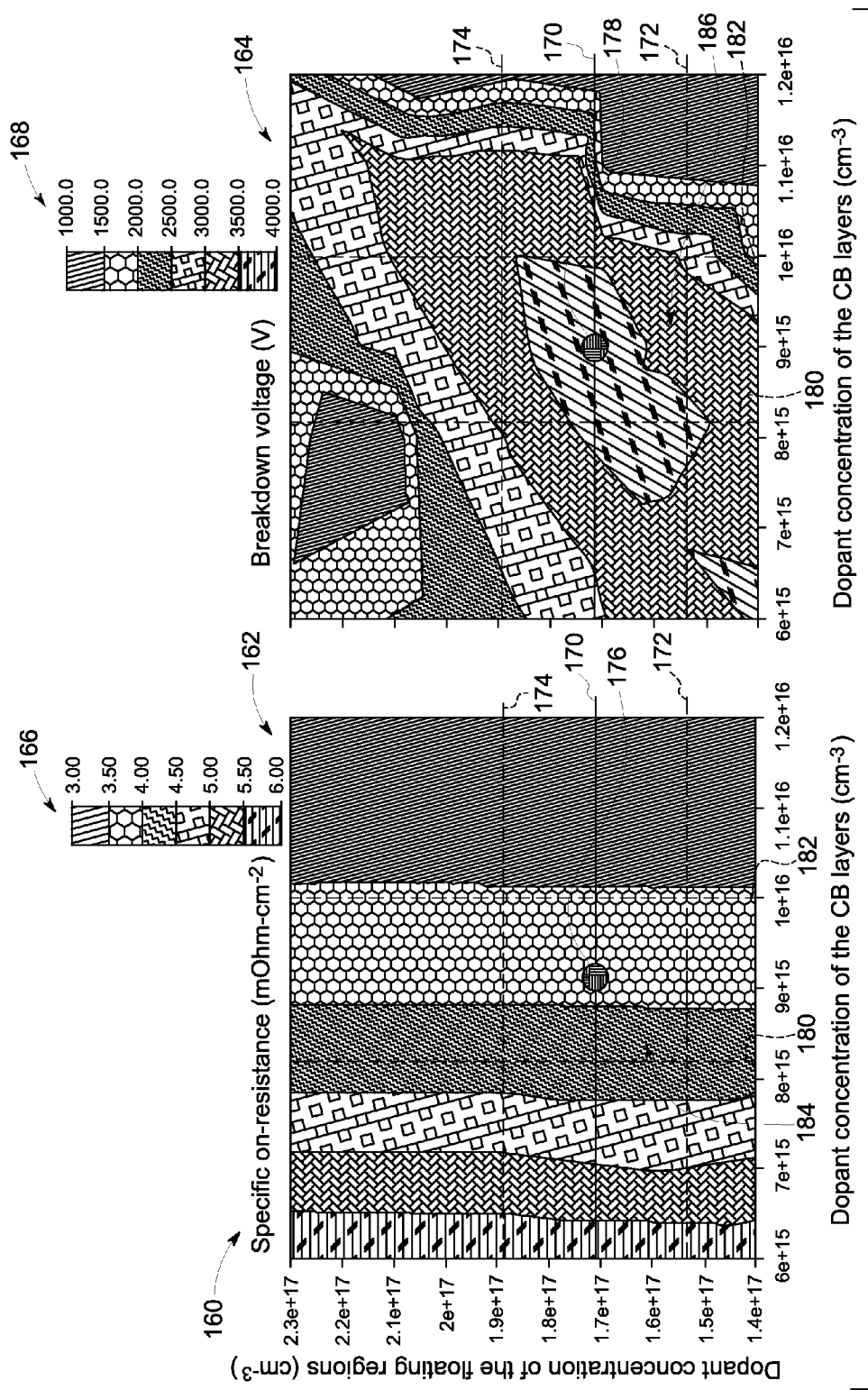
FIG. 7 depicts contour plots illustrating an specific on-resistance of a drift layer (left) and breakdown voltage (right) for various embodiments of the SiC-SJ device of FIG. 1.

FIG. 7 includes contour plots 160 representative of the specific on-resistance of the drift layer (at room temperature) and the breakdown voltage as a function of doping concentration in the floating regions 26 and doping concentration in the CB layers 24A and 24B for embodiments of the SiC-SJ device 10. It may be noted that, for the embodiments represented in FIG. 7, the epi doping concentration of in the layer 14 is substantially the same as the epi doping concentration of the CB layers 24A and 24B. For the SiC-SJ device embodiment represented in FIG. 7, the thicknesses 32A and 32B of each of the n-type drift layers 24A and 24B is 10 µm, the thickness 40 of the floating regions 26 is 1 µm, and the width 42 of the floating regions 26 is 2 µm, and the spacing 44 between the floating regions 26 is 3 µm. The contour plots 162 and 164 include dopant concentration of the floating regions 26 on the vertical axes and n-type dopant concentration of the epi layers 24A and 24B on the horizontal axes. The graph 162 on the left in FIG. 7 illustrates drift specific on-resistance contours, and, as indicated by the key 166, each contour of the graph 162 represents a different specific on-resistance value ranging from 3 mOhm·cm$^{-2}$ to 6 mOhm·cm$^{-2}$. The graph 164 on the right in FIG. 7 illustrates breakdown voltage contours, and, as indicated by the key 168, each contour of the graph 164 represents a different breakdown voltage ranging from 1 kV to 4 kV.

For embodiments of the SiC-SJ device 10 represented in the graph 160 of FIG. 7, the solid horizontal line 170 represents the desired dopant concentration of approximately $1.7 \times 10^{17}$ cm$^{-3}$ for the floating regions 26, which is within the ranges discussed above. The dashed horizontal lines 172 and 174 respectively represent a doping concentration that is 10% lower and 10% higher than the target dopant concentration for the floating regions 26. As such, these dashed horizontal lines 172 and 174 define a ±10% range to represent potential variation in the dopant concentration of the floating regions 26 that may result from variation in the implantation process and/or material properties. The points 176 and 178 are positioned at the intersection of the desired dopant concentration of the floating regions 26 (e.g., approximately $1.7 \times 10^{17}$ cm$^{-3}$) and the desired dopant concentration of the two n-type SiC epitaxial layers 24A and 24B (e.g., approximately $9 \times 10^{15}$ cm$^3$).

Further, the dashed vertical lines 180 and 182 of FIG. 7 respectively represent a doping concentration that is 10% lower and 10% higher than the target dopant concentration for the CB layers 24A and 24B. As such, these dashed vertical lines 180 and 182 define a ±10% range to represent variation in the dopant concentration of the CB layers 24A and 24B that may result from epitaxial growth process and/or material properties variation. Accordingly, the regions 184 and 186 formed by the intersections of the horizontal and vertical dashed lines 172, 174, 180, and 182 represent realistic practical ranges for the dopant concentration of the floating regions 26 and the dopant concentration in CB layers 24A and 24B that still provide desirable device performance. Accordingly, in order to maximize performance benefits, embodiments of the SiC-SJ device 10 provide desirable device performance (e.g., specific on-resistance of 7 mOhm-cm$^{-2}$ or below, a blocking voltage of 3 kV or above) within the practically expected ranges of variation for the dopant concentrations of the floating regions 26 and the CB layers 24A and 24B (e.g., within the entire regions 184 and 186).

As illustrated in the graph 162 of FIG. 7, for embodiments of the SiC-SJ device 10, the specific on-resistance of the drift layer at room temperature is between 3.5 mOhm-cm$^{-2}$ and 4.3 mOhm-cm$^{-2}$ over the practically controllable range of dopant concentration for the floating regions 26 and the epi layers 24 (e.g., over the entire area 184). Further, as illustrated in the graph 164 of FIG. 7, the blocking voltage of the drift layer for the SiC-SJ device 10 is greater than 3 kV over the practically controllable range of dopant concentration for the floating regions 26 and the drift layers 24 (e.g., over the entire area 186). Since the specific on-resistance of an ideal 3 kV 1-D device drift layer design is approximately 7 mOhm·cm$^{-2}$, it should be appreciated that the represented embodiments of the three-layer SiC-SJ device 10 enables a 40% to 50% reduction in specific on-resistance of a drift region compared to that of an ideal 3 kV 1-D device drift layer design.

Figure 8:
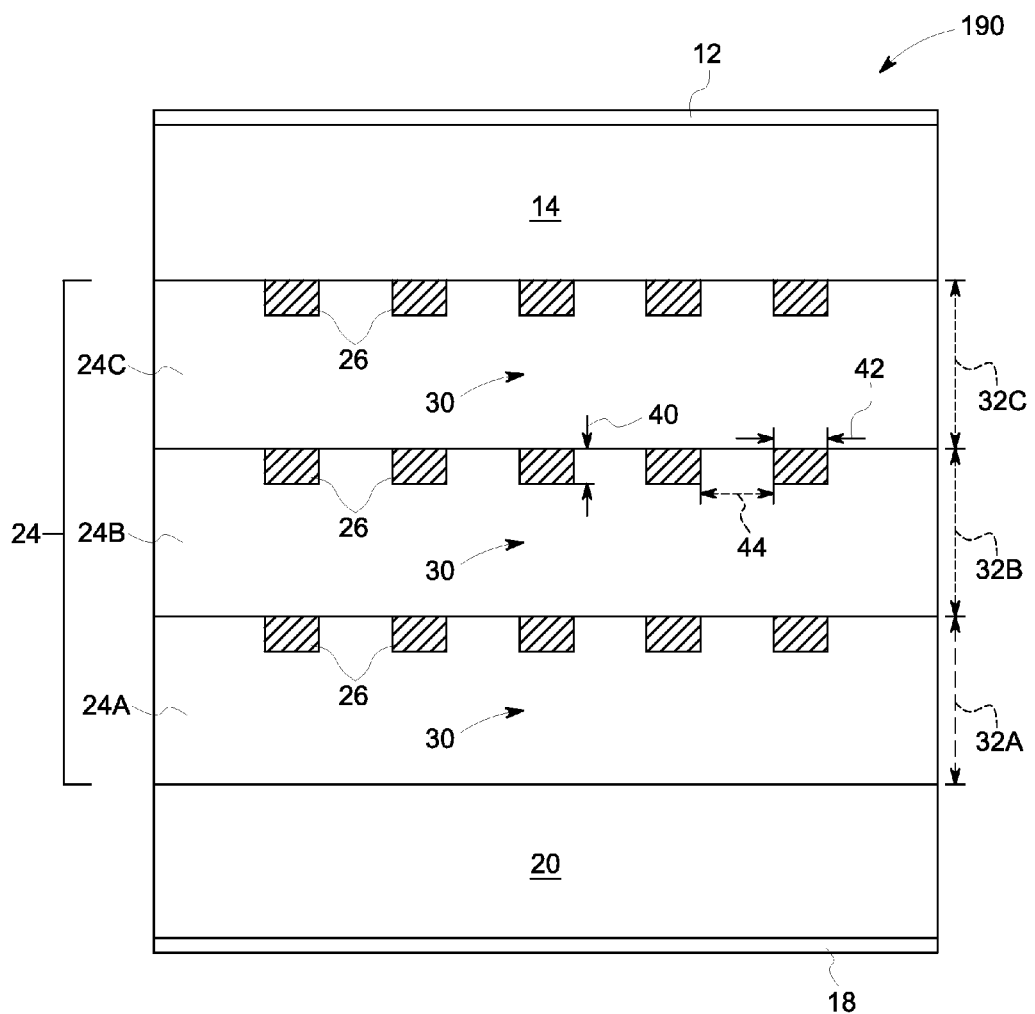
FIG. 8 is a schematic illustrating a cross-sectional view of the active area of a multi-layer SiC-SJ device having three epitaxial layers that include floating regions, in accordance embodiments with the present approach.

Another embodiment of a multi-layered SiC-SJ device 190 is illustrated in FIG. 8. The illustrated embodiment of FIG. 8 is a 4.5 kV SiC-SJ Schottky device 190 having a similar structure to the SiC-SJ 10 illustrated in FIG. 1. However, the SiC-SJ device 190 illustrated in FIG. 8 has three CB layers 24, including a lower layer 24A, a middle layer 24B, and an upper layer 24C. The illustrated SiC-SJ 190 has a doping concentration in the floating regions 26, as well as a spacing 44 between the floating regions 26, falling within the ranges set forth above.

Figure 9:
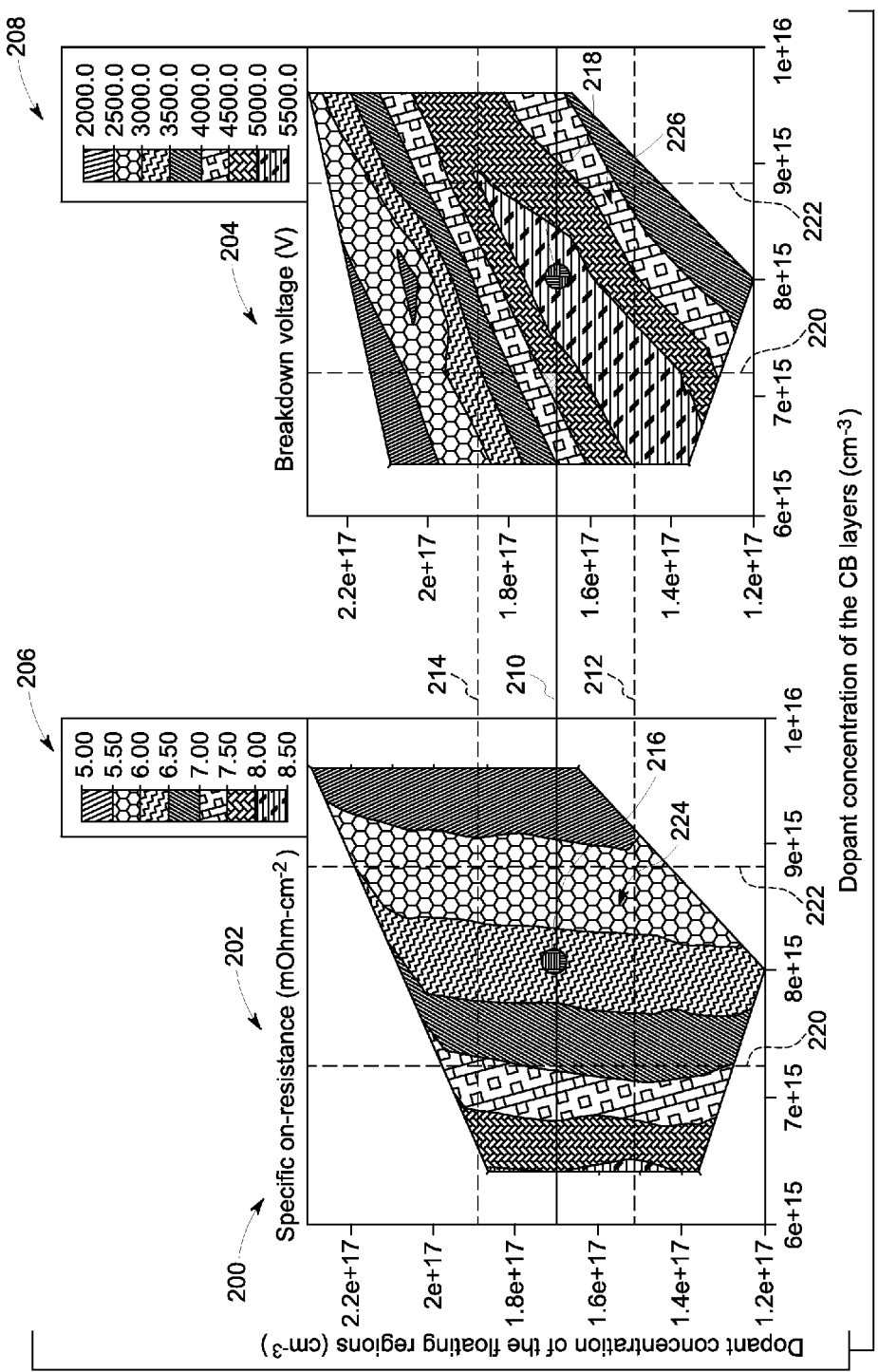
FIG. 9 depicts contour plots illustrating an example of specific on-resistance of a drift layer (left) and blocking voltage (right) for various embodiments of the SiC-SJ device of FIG. 8.

FIG. 9 is a contour plot graph 200 representative of the specific on-resistance of the drift layer at room temperature (in graph 202) and breakdown voltage (in graph 204) for embodiments of the SiC-SJ device 190 illustrated in FIG. 8. More specifically, the contour graph 200 of FIG. 9 includes dopant concentration of the floating regions 26 on the vertical axes and n-type dopant concentration of the SiC CB layers 24 on the horizontal axes of the graphs 202 and 204. The graph 202 on the left in FIG. 9 illustrates specific on-resistance contours, and, as indicated by the key 206, each contour of the graph 202 represents a different specific on-resistance value ranging from 5 mOhm-cm$^{-2}$ to 8.5 mOhm-cm$^{-2}$. The graph 204 on the right in FIG. 9 illustrates breakdown voltage contours, and, as indicated by the key 208, each contour of the graph 204 represents a different breakdown voltage ranging from 2 kV to 5.5 kV. Additionally, for the embodiments of the SiC-SJ device 190 represented in FIG. 9, the width 42 of the floating regions 26 is 2 µm, the thicknesses 32A, 32B, and 32C of each of the three n-type SiC epitaxial layers 24A, 24B, and 24C is 10 µm, the spacing 44 between the floating regions 26 is 3 µm, and the thickness 44 of the floating regions 26 is 1 µm.

Like the graph 160 of FIG. 7, the solid horizontal line 210 of FIG. 9 represents a desired dopant concentration of approximately $1.7 \times 10^{17}$ cm$^{-3}$ for the floating regions 26, which is within the ranges set forth above. The dashed horizontal lines 212 and 214 in FIG. 9 define a ±10% range to represent anticipated variation in the dopant concentration of the floating regions 26 that may result from process and/or material variation. The points 216 and 218 are positioned at the intersection of the desired dopant concentration of the floating regions 26 (e.g., approximately $1.7 \times 10^{17}$ cm$^{-3}$) and the desired n-type dopant concentration for the n-type CB layers 24 (e.g., approximately $8 \times 10^{15}$ cm$^{-3}$). Further, the dashed vertical lines 220 and 222 define a ±10% range to represent anticipated variation in the dopant concentration of the CB layers 24 that may result from process and/or material variation. As such, the regions 224 and 226 formed by the intersections of the horizontal and vertical dashed lines 212, 214, 220, and 222 represent practically controllable ranges for the dopant concentration of the floating regions 26 and the drift layers 24.

As illustrated in the graph 202 of FIG. 9, the specific on-resistance for embodiments of the four-layer SiC-SJ device 190 is between 5.5 mOhm-cm$^{-2}$ and 7 mOhm-cm$^{-2}$ over the practically controllable range of dopant concentration for the floating regions 26 and the CB layers 24 (e.g., over the entire area 224). As illustrated in the graph 204 of FIG. 9, the blocking voltage for embodiments of the four-layer SiC-SJ device 190 is greater than 4.5 kV over most of the practically controllable range of dopant concentration for the floating regions 26 and the CB layers 24 (e.g., over most of the area 226). Since the specific on-resistance of an ideal 4.5 kV 1-D device design is approximately 20 mOhm-cm$^{-2}$, it should be appreciated that embodiments of the four-layer SiC-SJ device 190 enable a 60% to 70% reduction in drift region specific on-resistance compared to that of an ideal 1-D device design.

This written description uses examples to disclose the technique, including the best mode, and also to enable any person skilled in the art to practice the technique, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A silicon carbide (SiC) super-junction (SJ) device, comprising:
an active area including one or more charge balance (CB) layers, wherein each CB layer comprises:
a semiconductor layer having a first conductivity-type; and
a plurality of floating regions having a second conductivity-type disposed in a surface of the semiconductor layer, wherein the plurality of floating regions and the semiconductor layer are both configured to substantially deplete to provide substantially equal amounts of charge from ionized dopants when a reverse bias is applied to the SiC-SJ device, wherein a doping concentration of the plurality of floating regions is between $2\times10^{16}$ cm$^{-3}$ and $1\times10^{18}$ cm$^{-3}$, and wherein a spacing between the plurality of floating regions of a particular CB layer of the one or more CB layers is greater than or equal to 10% of a thickness of the particular CB layer and is less than or equal to the thickness of the particular CB layer.

2. The SiC-SJ device of claim 1, wherein a thickness of the plurality of floating regions is greater than 1 μm.

3. The SiC-SJ device of claim 1, wherein a width of the plurality of floating regions is between 0.1 μm and 2 μm.

4. The SiC-SJ device of claim 1, wherein a spacing between the plurality of floating regions is between 1 μm and 6 μm.

5. The SiC-SJ device of claim 1, wherein the plurality of floating regions has p-type doping and the semiconductor layer has n-type doping.

6. The SiC-SJ device of claim 1, wherein the doping concentration of the plurality of floating regions divided by a thickness of the floating regions is greater than or equal to $5\times10^{12}$ cm$^{-3}$.

7. The SiC-SJ device of claim 1, wherein an effective sheet doping concentration of the plurality of floating regions is less than or equal to $1.1\times10^{13}$ cm$^{-2}$.

8. The SiC-SJ device of claim 6, wherein the doping concentration of the plurality of floating regions is between $5\times10^{16}$ cm$^{-3}$ and $5\times10^{17}$ cm$^{-3}$.

9. The SiC-SJ device of claim 8, wherein the doping concentration of the plurality of floating regions is between $1.5\times10^{17}$ cm$^{-3}$ and $1.9\times10^{17}$ cm$^{-3}$.

10. The SiC-SJ device of claim 1, wherein the semiconductor layer has a dopant concentration of the first conductivity-type that is greater than or equal to $5\times10^{15}$ cm$^{-3}$.

11. The SiC-SJ device of claim 1, wherein the one or more CB layers each have a thickness that is between 5 μm and 20 μm.

12. The SiC-SJ device of claim 1, wherein, for a particular CB layer of the one or more CB layers, the product of a thickness of the particular CB layer and a uniform dopant concentration of the first conductivity-type in the semiconductor layer of the particular CB layer is less than $1.1\times10^{13}$ cm$^{-2}$.

13. The SiC-SJ device of claim 1, wherein the SiC-SJ device has a breakdown voltage greater than 3 kV and a drift layer specific on-resistance at room temperature that is less than 7 mOhm·cm$^{-2}$.

14. A method of manufacturing a silicon carbide (SiC) super-junction (SJ) device, comprising:
fabricating a first charge balance (CB) layer, comprising:
forming a first semiconductor layer having a first conductivity-type on top of a SiC substrate layer; and
implanting a first plurality of floating regions having a second conductivity-type into the first semiconductor layer, wherein a doping concentration of the first plurality of floating regions is between approximately $2\times10^{16}$ cm$^{-3}$ and approximately $1\times10^{18}$ cm$^{-3}$, and wherein a spacing between the first plurality of floating regions is greater than or equal to 10% of a thickness of the first semiconductor layer and less than or equal to the thickness of the first semiconductor layer.

15. The method of claim 14, wherein implanting the first plurality of floating regions comprises implanting using implantation energies less than approximately 1 MeV.

16. The method of claim 14, wherein a thickness of the first plurality of floating regions is less than or equal to approximately 1 μm.

17. The method of claim 14, wherein the product of the thickness of the first semiconductor layer and a uniform dopant concentration of the first conductivity-type in the first semiconductor layer is less than $1.1\times10^{13}$ cm$^{-2}$.

18. The method of claim 14, comprising:
fabricating a second CB layer, comprising:
forming, on top of the first CB layer, a second semiconductor layer having the first conductivity-type; and
implanting a second plurality of floating regions having the second conductivity-type into the second semiconductor layer, wherein a doping concentration of the second plurality of floating regions is between approximately $2\times10^{16}$ cm$^{-3}$ and approximately $1\times10^{18}$ cm$^{-3}$, and wherein a spacing between the second plurality of floating regions is greater than or equal to 10% of a thickness of the second semiconductor layer and less than or equal to the thickness of the second semiconductor layer.

* * * * *